United States Patent
Minamio et al.

(10) Patent No.: US 7,265,340 B2
(45) Date of Patent: Sep. 4, 2007

(54) OPTICAL DEVICE AND METHOD FOR FABRICATING THE SAME

(75) Inventors: Masanori Minamio, Osaka (JP); Kiyokazu Itoi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 175 days.

(21) Appl. No.: 11/137,549

(22) Filed: May 26, 2005

(65) Prior Publication Data

US 2005/0274882 A1    Dec. 15, 2005

(30) Foreign Application Priority Data

Jun. 10, 2004   (JP)   ............... 2004-173108

(51) Int. Cl.
*H01L 23/08*   (2006.01)
(52) U.S. Cl. .................................. 250/239; 257/433
(58) Field of Classification Search ........ 257/431–434; 250/239, 216, 201.5; 359/819
See application file for complete search history.

(56) References Cited

U.S. PATENT DOCUMENTS 5,998,862 A * 12/1999 Yamanaka .................. 257/704

2004/0232507 A1* 11/2004 Furukubo .................. 257/433

FOREIGN PATENT DOCUMENTS

JP    2001-111159    4/2001

* cited by examiner

*Primary Examiner*—Thanh X. Luu
*Assistant Examiner*—Tony Ko
(74) *Attorney, Agent, or Firm*—McDermott Will & Emery LLP

(57) ABSTRACT

An optical device comprises a copper plate having an opening; a flexible board placed below the copper plate; a light receiving element substrate placed below the copper plate and mounted on a wiring pattern of the flexible board via bumps; a light emitting element and a light receiving element both provided at the principal surface of the light receiving element substrate; and a supporting frame supporting the flexile board in a downwardly posture. The supporting frame fixes the flexible board and the copper plate. Therefore, a thin optical device can be realized without employing a resin mold structure.

14 Claims, 7 Drawing Sheets

OPTICAL DEVICE AND METHOD FOR FABRICATING THE SAME

CROSS-REFERENCE TO RELATED APPLICATIONS

The present application claims priority under 35 USC 119(a) to Japanese Patent Application No. 2004-173108 filed on Jun. 10, 2004 the entire contents of which are hereby incorporated by reference.

BACKGROUND OF THE INVENTION (a) Field of the Invention

The present invention relates to an optical device which is made by mounting on a mounting substrate a light receiving element such as an image sensor and a light emitting element such as a laser light emitting element.

(b) Description of Related Art

Conventionally, optical devices (e.g., a hologram unit) have been widely used which were made by mounting on a mounting substrate a light receiving element such as an image sensor and a light emitting element such as a laser light emitting element. FIGS. 7A and 7B are perspective views illustrating the states of a conventional optical device without/with a hologram, respectively.

As shown in FIG. 7A, the conventional optical device includes a light emitting element 102 and a light receiving element 103 both which are mounted on a leadframe 101 having a die pad and leads; a resin-made supporting member 104 which encapsulates the light receiving element 103 and the leadframe 101; and external terminals 105 which protrude from two opposite sides of the supporting member 104 in the width direction. As shown in FIG. 7B, in the case where a hologram 106 is equipped, the optical device is used as a hologram unit. However, the hologram 106 is not always necessary, and in that case, the optical device employs a structure in which a glass window is arranged on the supporting member 104.

SUMMARY OF THE INVENTION

However, with size reduction of equipment to be attached, recent optical devices are facing stricter restrictions on dimensions such as thickness. Meanwhile, conventional optical devices as illustrated in FIGS. 7A and 7B employ a structure based on a resin mold, and therefore have gradually increasing difficulty in satisfying required dimensional reduction. For example, due to the restriction on thickness of the optical device, the thickness of ribs 104a of the supporting member 104 shown in FIG. 7A is also strictly restricted. However, in the case of employing a resin mold structure, there is a limitation in reducing the thickness of the ribs 104a because of the necessity for maintaining a successful flow and the strength of a sealing resin during an encapsulating process.

An object of the present invention is to reduce the thickness of an optical device by employing a structure other than the resin mold structure, and hence to realize size reduction of equipment to which the optical device is attached.

The optical device in accordance with the present invention includes below a base having an opening, a flexible board with a wiring pattern, and an optical element located within the opening of the base in a two-dimensional view, in which an optical element chip mounted on the flexible board is placed and a frame supporting the flexible board with the flexible board bent upward or downward is provided.

With this structure, since the flexible board with a wiring pattern is used, the resin mold structure does not need to be employed. Therefore, there is no dimensional restriction caused by the necessity for maintaining a successful flow of a sealing resin and it becomes easier to keep the strength of the sealing resin. Accordingly, the reduction of thickness of the optical device is realized, and hence it is possible to address size reduction of the equipment to which the optical device is arranged. In addition, since the optical device of the invention employs a structure in which an optical element chip is mounted on the flexible board with a conductive, such as a bump, being interposed therebetween, there is no need to use a fine metal wire. As a result, further size reduction of the equipment can be realized.

The optical element chip may be mounted on the flexible board with the principal surface thereof confronting the flexible board or with the back surface thereof confronting the flexible board. In the latter case, the optical element chip needs to have a through hole connection member.

The optical device may function as a hologram unit.

The base may be formed with a first alignment part serving as a reference point for alignment in mounting the optical element chip on the wiring pattern of the flexible board. Thus, a high-precision optical device can be easily realized.

The base may be formed with a second alignment part serving as a reference point for alignment in mounting optics on the substrate. Thus, a high-precision system such as an optical pickup can be constituted using the optical device of the present invention.

A method for fabricating an optical device in accordance with the present invention includes the steps of placing a flexible board with a wiring pattern below a base; electrically connecting the wiring pattern of the flexile board to the optical element chip; bending the flexible board upward or downward; and fitting the base and the flexible board into a frame.

Preferably, the base is formed with an alignment part, and the wiring pattern is aligned relatively with the optical element chip using the alignment part in mounting the optical element chip on the wiring pattern of the flexible board. As a result, a high-precision optical device can be easily manufactured.

DETAILED DESCRIPTION OF THE INVENTION

First Embodiment

Figure 1:
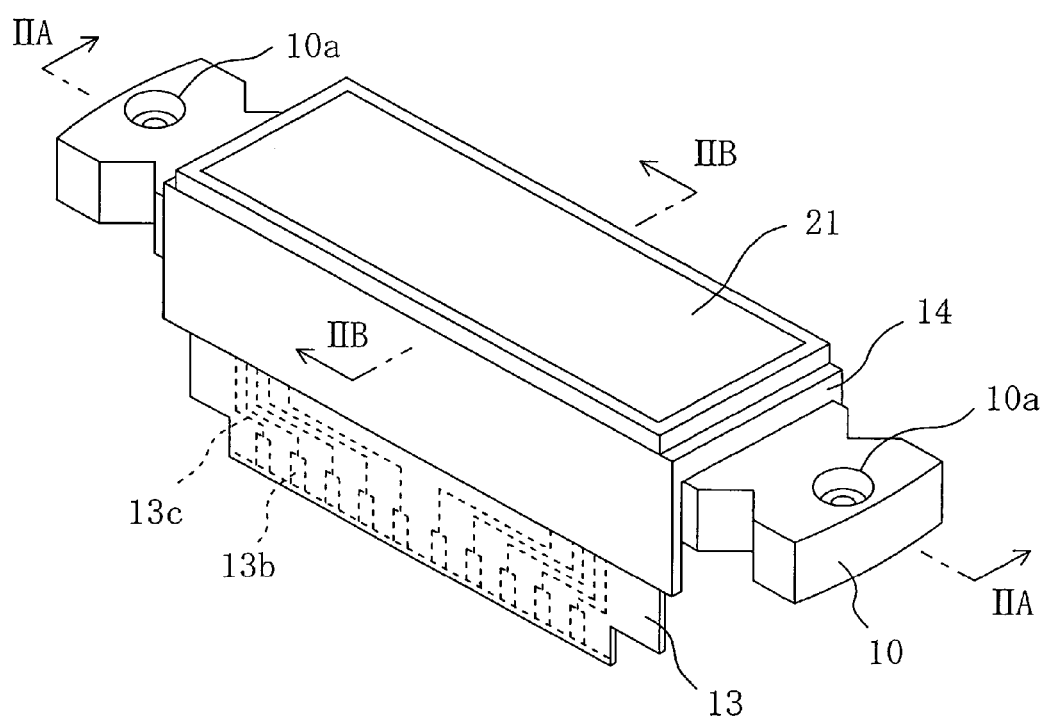
FIG. 1 is a perspective view illustrating the structure of an optical device according to a first embodiment of the present invention.
Figure 2B:
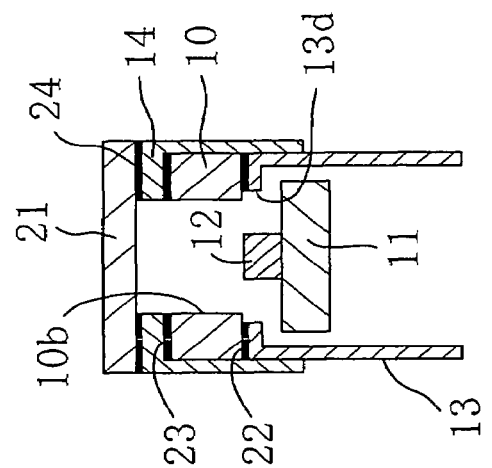
FIGS. 2A and 2B are cross sectional views of the optical device according to the first embodiment taken along lines IIa-IIa and IIb-IIb, respectively, in FIG. 1.
Figure 2A:
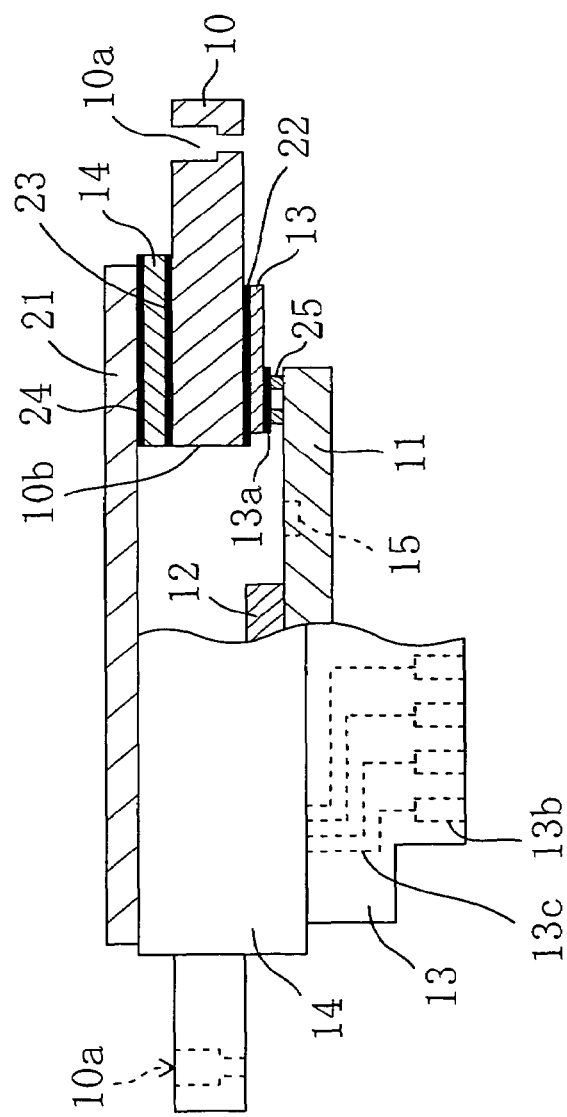

FIG. 1 is a perspective view illustrating the structure of an optical device according to a first embodiment of the present invention, and FIGS. 2A and 2B are cross sectional views taken along lines IIa-IIa and IIb-IIb, respectively, in FIG. 1.

As shown in FIGS. 1, 2A and 2B, the optical device of the first embodiment includes a copper plate 10 serving as a base with a cooling function; a flexible board 13 attached to the copper plate 10 through an adhesive layer 22; a light receiving element substrate 11 serving as an optical element chip having flip-chip connection with the flexible board 13; a light emitting element 12 serving as an optical element mounted on the principal surface of the light receiving element substrate 11; a light receiving element 15 serving as an optical element provided at the principal surface of the light receiving element substrate 11; a metallic supporting frame 14 attached to the top surface of the copper plate 10 through an adhesive layer 23 and extending from two opposite side surfaces of the cooper plate 10 to partway along the sidewalls of the flexible board 13 bent downward in an inverted U-shape to support the bent flexible board 13; and a glass window 21 attached to the top surface of the supporting frame 14 through an adhesive layer 24.

A wiring pattern is formed in one surface of the flexible board 13. The wiring pattern includes internal terminals 13a for establishing signal connection between the light receiving element substrate 11 and the light emitting element 12; external terminals 13b for establishing signal connection with external equipment; and wirings (printed wirings) 13c for connecting the internal terminals 13a and the external terminals 13b. The internal terminals 13a of the flexible board 13, which are arranged in two rows, are electrically connected to pad electrodes (not shown) of the light receiving element substrate 11 by bumps 25 serving as conductive members. Moreover, although not shown, the wirings on the light receiving element substrate 11 are electrically connected to pad electrodes at the top surface side of the light emitting element 12 by signal connection members such as fine metal wires. Thus, both the light receiving element and the light emitting element are electrically connected with the wiring pattern of the flexible board 13. The flexible board 13 is bent in an inverted U-shape with the wiring pattern directed inward so that both sidewalls extend downward from the top end of the copper plate 10. Furthermore, the center of the flexible board 13 has an opening 13d.

The center of the copper plate 10 has an opening 10b which falls within the opening 13d of the flexible board 13 when viewed from above. Within the opening 10b, the light emitting element 12 and the light receiving element 15 on the light receiving element substrate 11 are located. In a general structure, although not shown, a mirror for reflecting upward a laser light transversely emitted from the light emitting element 12 is provided at the principal surface of the light receiving element substrate 11. Both ends of the copper plate 10 are formed with alignment holes 10a serving as reference points for aligning the light receiving element substrate 11 with the flexible board 13 in flip-chip connecting the light receiving element substrate 11 onto the flexible board 13. Each alignment hole 10a has a stepped shape of which the upper part has a large diameter and the lower part has a small diameter. The lower part with a small diameter is a first alignment part serving as a reference point for aligning the light receiving element substrate 11 with the flexible board 13 in flip-chip connecting the light receiving element substrate 11 onto the flexible board 13, while the upper part with a large diameter is a second alignment part in which a positioning pin is engaged in mounting a lens system on the optical device.

The supporting frame 14 is a member to which the glass window 21 is attached, and performs a function of supporting the flexible board 13 in a downwardly bent posture.

FIGS. 3A to 3D are perspective views illustrating an assembly process of the optical device according to the first embodiment.

Figure 3A:
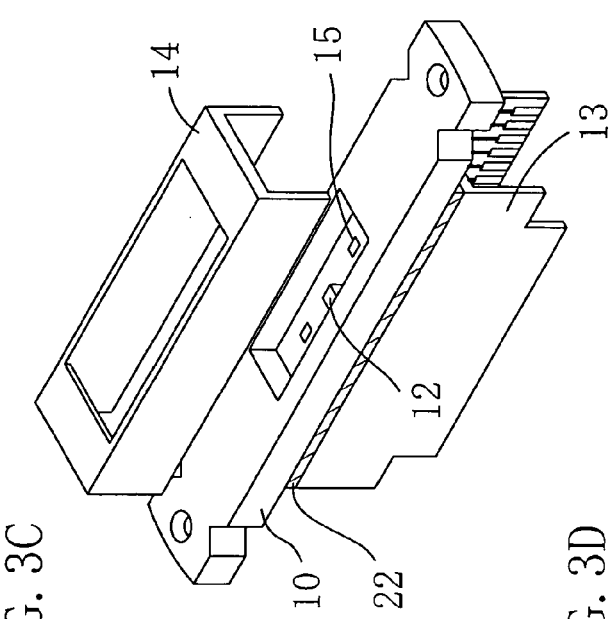
FIGS. 3A to 3D are perspective views illustrating an assembly process of the optical device according to the first embodiment.

In the process step illustrated in FIG. 3A, the bottom surface of the copper plate 10 and the back of the planar flexible board 13 are fixed by adhesive. In this case, the flexible board 13 is aligned with the copper plate 10 using the alignment hole 10a such that the center of the opening 13d of the flexible board 13 is substantially matched with the center of the opening 10b of the copper plate 10 when viewed from above and that the internal terminals 13a of the flexible board 13 are located in the surrounding area of the opening 10b of the copper plate 10, and the flexible board 13 is bonded in the aligned position onto the copper plate 10.

Figure 3C:
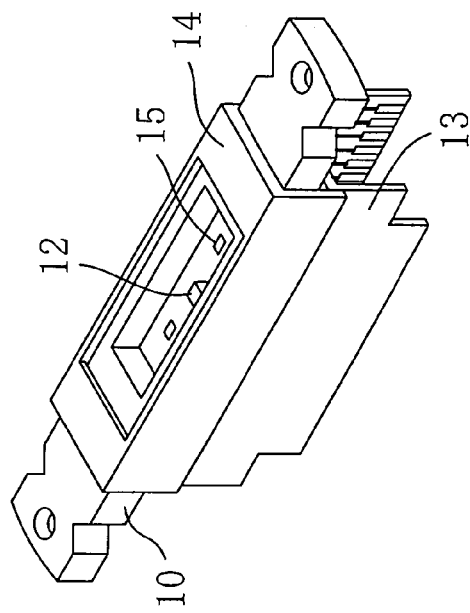
Figure 3B:
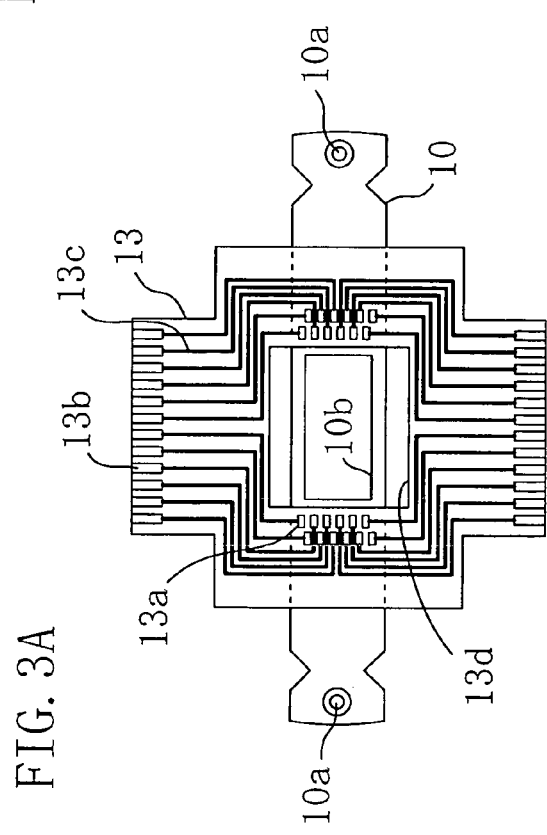

Next, in the process step illustrated in FIG. 3B, the light receiving element substrate 11 is placed on the flexible board 13 such that the principal surface of the light receiving element substrate 11 to which the light emitting element 12 is attached is faced downward (i.e., in a flip-chip mounting manner), and the internal terminals 13a of the flexible board 13 are connected with pad electrodes (not shown) of the light receiving element substrate 11 through the bumps 25. Then, the flexible board 13 is bent along the top surface and the side surfaces of the copper plate 10.

Next, in the process step illustrated in FIG. 3C, the top surface of the copper plate 10 is turned up and the supporting frame 14 is placed above the top surface of the copper plate 10.

Figure 3D:
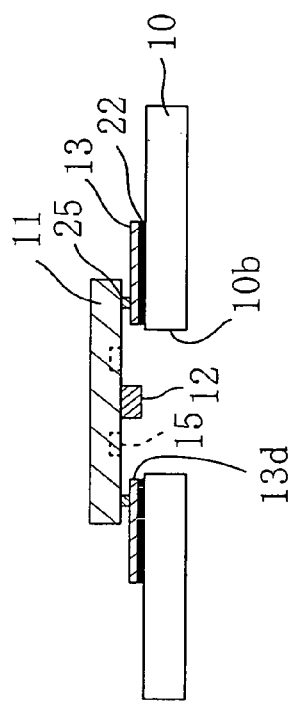

Then, in the process step illustrated in FIG. 3D, the supporting frame 14 is attached to the copper plate 10, and thereafter a glass window (not shown) is placed on the supporting frame 14. Through the aforementioned processes, the structure of the optical device illustrated in FIG. 1 can be obtained.

The supporting frame 14 may be fitted onto the copper plate 10 merely by a tightening force applied from the supporting frame 14, without the use of adhesive.

Note that in the first embodiment, the external terminals 13b of the flexible board 13 are connected with terminals of another flexible board that is connected with external equipment (not shown).

Figure 7A:
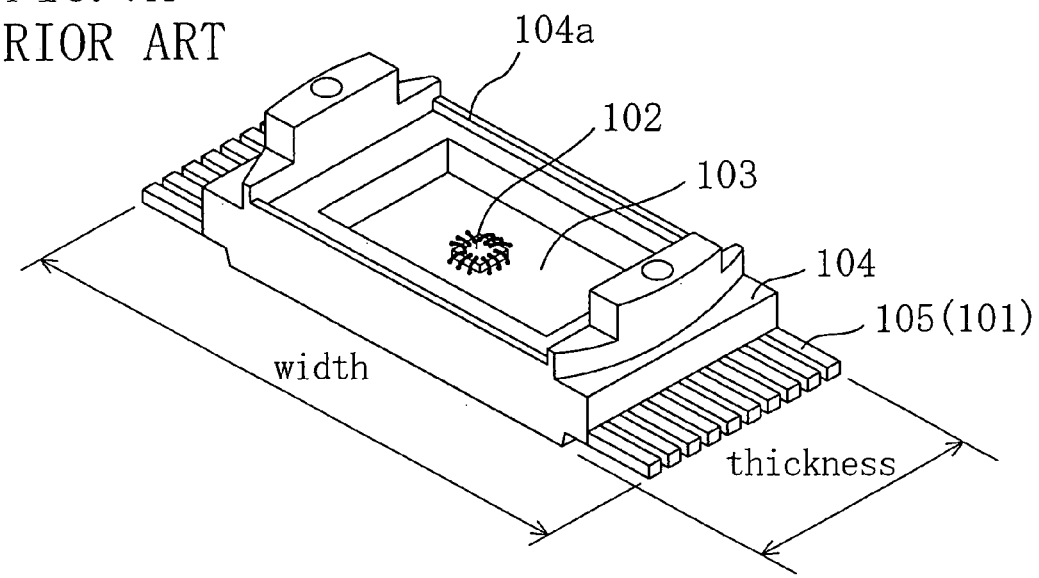
FIGS. 7A and 7B are perspective views illustrating the states of the conventional optical device without/with a hologram, respectively.
Figure 7B:
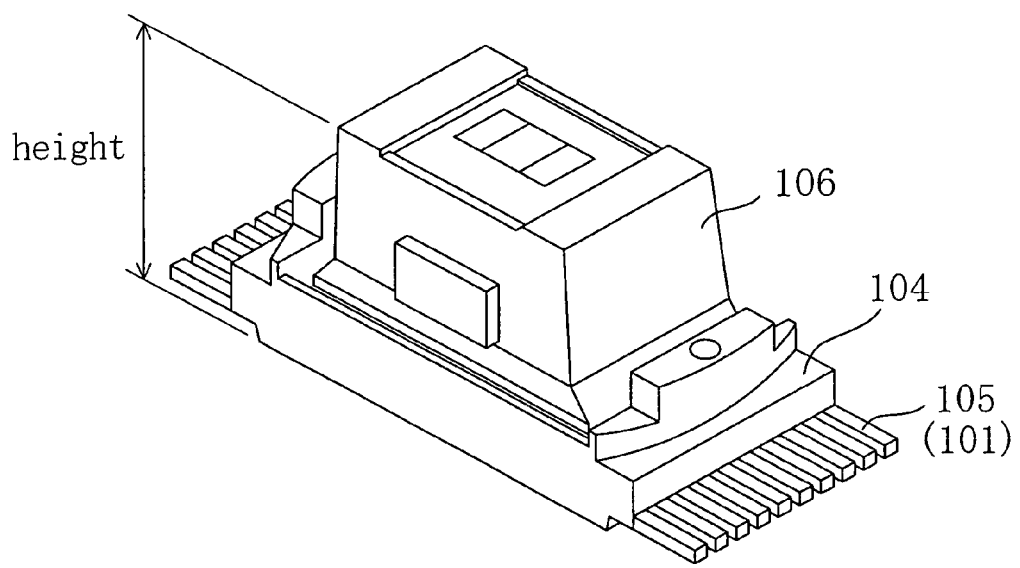

According to the optical device of the first embodiment, since the light receiving element substrate 11 has a direct flip-chip connection with the flexible board 13 and the copper plate 10 and the glass window 21 are connected to each other by the supporting frame 14, a thin optical device not having a resin mold structure can be realized. Moreover, since the supporting frame 14 may be made of metal (e.g., copper), the supporting frame 14 can be easily made thin such as 0.1 mm thick, differently from the ribs 104a of the supporting member 104 in the conventional optical device illustrated in FIG. 7. As a result, the reduction in thickness (e.g., 3 mm or less) of the optical device can be realized, and thus the size reduction of the equipment on which the optical device is mounted can be easily realized.

Moreover, the flexible board 13 is bent along the top surface and the side surfaces of the copper plate 10 such that both sidewalls of the flexible board 13 extend perpendicularly to the mounting surface of the copper plate 10 (the surface thereof on which the light receiving element substrate 11 and the light emitting element 12 are mounted). Therefore, it is possible to increase the number of external terminals for electrically connecting to external equipment as compared with the conventional structure while suppressing increase in the thickness (see FIG. 7A) of the optical device.

Moreover, since the corners of the bent portions of the flexible board 13 are covered with the supporting frame 14, it is possible to definitely prevent the radius of curvature of the bent portions of the flexible board 13 from increasing and thus the thickness from increasing.

Furthermore, since the base having a cooling function is formed of the copper plate 10, it is possible to immediately dissipate production heat of the optical device to which a high heat producing element such as a laser light emitting element is mounted to cool the entire device.

In the aforementioned embodiment, the optical device including the light receiving element substrate 11 and the light emitting element 12 has been described, but the optical device of the present invention may include at least either a light receiving element or a light emitting element as an optical element.

The supporting frame 14 may be fixed to the flexible board 13 through an adhesive layer, or without an adhesive layer as shown in FIGS. 2A and 2B.

Modification

Figure 4:
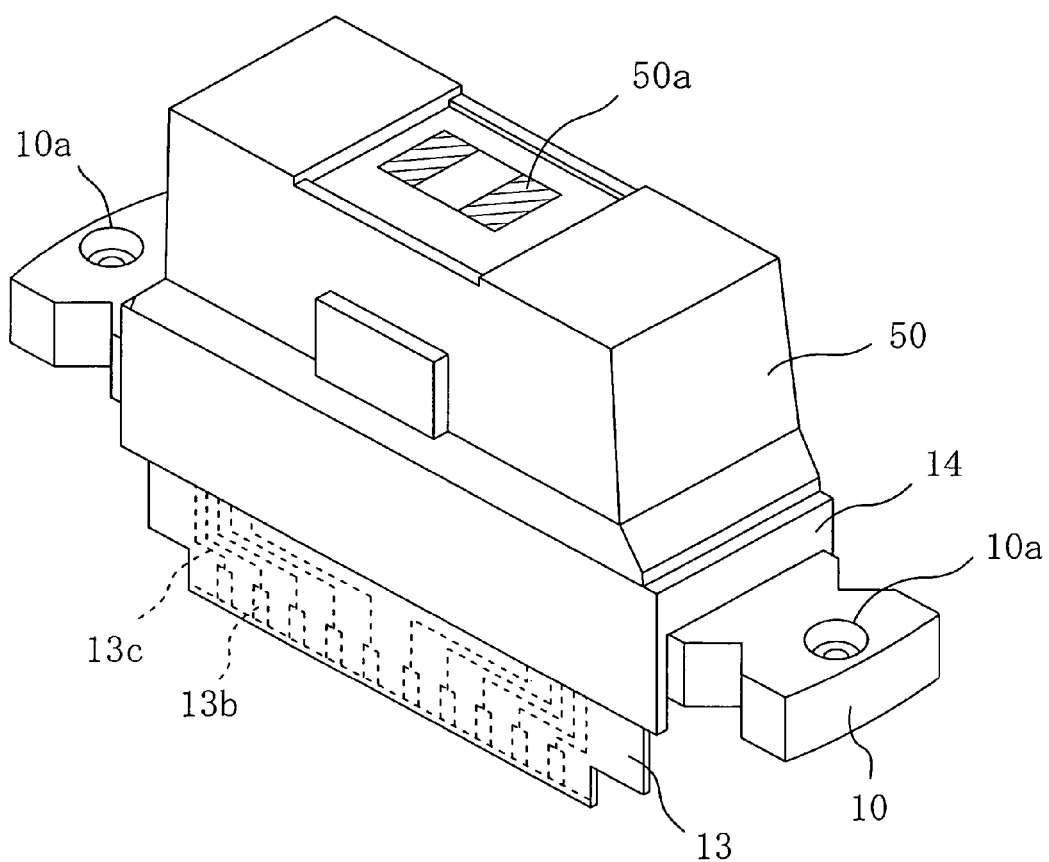
FIG. 4 is a perspective view schematically illustrating the structure of an optical device (hologram unit) according to a modification of the first embodiment of the present invention.

FIG. 4 is a perspective view schematically illustrating the structure of an optical device (hologram unit) according to a modification of the first embodiment of the present invention. As shown in FIG. 4, in the hologram unit of the modification, a hologram 50 having a hologram region 50a is mounted on the supporting frame 14 in lieu of the glass window of the optical device of the first embodiment. The other components are the same as in the optical device of the first embodiment.

According to the modification, the hologram unit having the possibility of exhibiting the similar effect to the first embodiment can be obtained.

Second Embodiment

Figure 5B:
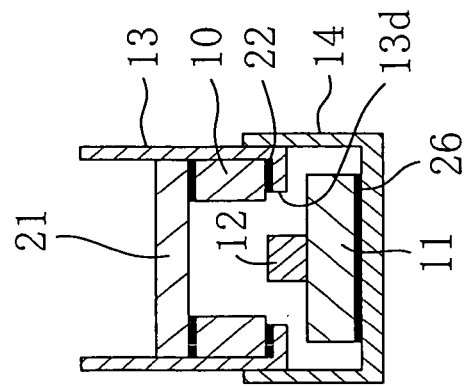
FIGS. 5A and 5B are cross sectional views of the optical device according to a second embodiment of the present invention taken along lines IIa-IIa and IIb-IIb, respectively, in FIG. 1.
Figure 5A:
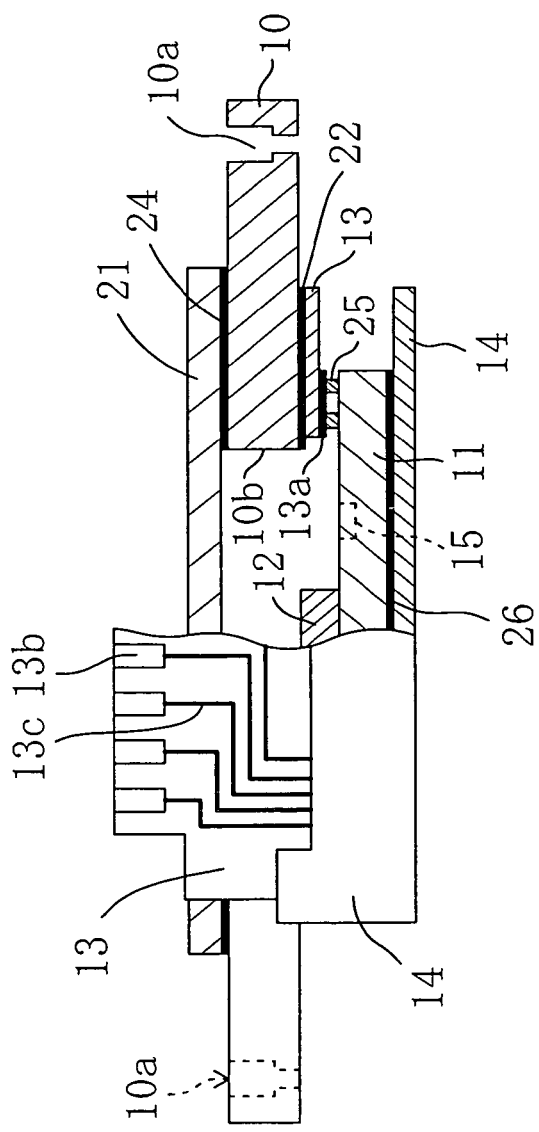

FIGS. 5A and 5B are cross sectional views of an optical device according to a second embodiment of the present invention taken along lines IIa-IIa and IIb-IIb, respectively, in FIG. 1.

As shown in FIGS. 5A and 5B, the optical device of the second embodiment includes a copper plate 10 serving as a base with a cooling function, a flexible board 13 attached to the copper plate 10 through an adhesive layer 22; a light receiving element substrate 11 serving as an optical element chip having flip-chip connection with the flexible board 13; a light emitting element 12 serving as an optical element mounted on the principal surface of the light receiving element substrate 11; a light receiving element 15 serving as an optical element provided at the principal surface of the light receiving element substrate 11; a metallic supporting frame 14 attached to the bottom surface of the light receiving element substrate 11 through an adhesive layer 26 and extending from two opposite side surfaces of the light receiving element substrate 11 to partway along the sidewalls of the flexible board 13 bent upward in a U-shape to support the bent flexible board 13; and a glass window 21 attached to the top of the copper plate 10 through an adhesive layer 24.

A wiring pattern is formed in one surface of the flexible board 13. The wiring pattern includes internal terminals 13a for establishing signal connection between the light receiving element substrate 11 and the light emitting element 12; external terminals 13b for establishing signal connection with external equipment; and wirings (printed wirings) 13c for connecting the internal terminals 13a and the external terminals 13b. The internal terminals 13a of the flexible board 13, which are arranged in two rows, are electrically connected to pad electrodes (not shown) of the light receiving element substrate 11 by bumps 25 serving as conductive members. Moreover, although not shown, the wirings on the light receiving element substrate 11 are electrically connected to pad electrodes at the top surface of the light emitting element 12 by signal connection members such as fine metal wires. Thus, both the light receiving element and the light emitting element are electrically connected to the wiring pattern of the flexible board 13. The flexible board 13 is bent in a U-shape with the wiring pattern directed outward so that both sidewalls extend upward from the bottom end of the light receiving substrate 11. The center of the flexible board 13 has an opening 13d.

The center of the copper plate 10 has an opening 10b which falls within the opening 13d of the flexible board 13 when viewed from above. Within the opening 10b, the light emitting element 12 and the light receiving element 15 on the light receiving element substrate 11 are located. In a general structure, although not shown, a mirror for reflecting upward a laser light transversely emitted from the light emitting element 12 is provided at the principal surface of the light receiving element substrate 11. Both ends of the copper plate 10 are formed with alignment holes 10a serving as reference points for aligning the light receiving element substrate 11 with the flexible board 13 in flip-chip connecting the light receiving element substrate 11 onto the flexible board 13. Each alignment hole 10a has a stepped shape of which the upper part has a large diameter and the lower part has a small diameter. The lower part with a small diameter is a first alignment part serving as a reference point for aligning the light receiving element substrate 11 with the flexible board 13 in flip-chip connecting the light receiving element substrate 11 onto the flexible board 13, while the upper part with a large diameter is a second alignment part in which a positioning pin is engaged in mounting a lens system on the optical device.

The supporting frame 14 provides a secure connection among the light receiving element substrate 11, the flexible board 13 and the copper plate 10, and performs a function of supporting the flexible board 13 in an upwardly bent posture.

As mentioned above, the optical device according to the second embodiment is different from the optical device according to the first embodiment in that the supporting frame 14 supports the flexible board 13 to the copper plate 10 from below of the light receiving element substrate 11 and the flexible board 13 is bent upward with the wiring pattern directed outward. However, the other configurations of the second embodiment are the same as those of the first embodiment. Hence, the optical device of the second embodiment can achieve substantially the same effects as the first embodiment.

Particularly in the optical device of the second embodiment, since only the thin adhesive layer 26 exists between the metallic supporting frame 14 and the light receiving element substrate 11, the optical device has an advantage of efficiently dissipating heat generated in the light emitting element 12 through the light receiving element substrate 11 to the supporting frame 14.

Illustration of a process of fabricating the optical device of the second embodiment is omitted. In this embodiment, after the process steps illustrated in FIGS. 3A and 3B according to the first embodiment, the supporting frame 14 is covered from below with the flexible board 13 bent upward in a U-shape, thereby easily obtaining the structure shown in FIG. 5.

The second embodiment has described the optical device including the light receiving element substrate 11 and the light emitting element 12, but the optical device of the present invention may include at least either a light receiving element or a light emitting element as an optical element.

The supporting frame 14 may be fixed to the flexible board 13 through an adhesive layer or without an adhesive layer as shown in FIGS. 5A and 5B.

In the second embodiment, the optical device is also used as a hologram unit by mounting a hologram in lieu of the glass window like the modification of the first embodiment.

Third Embodiment

Figure 6B:
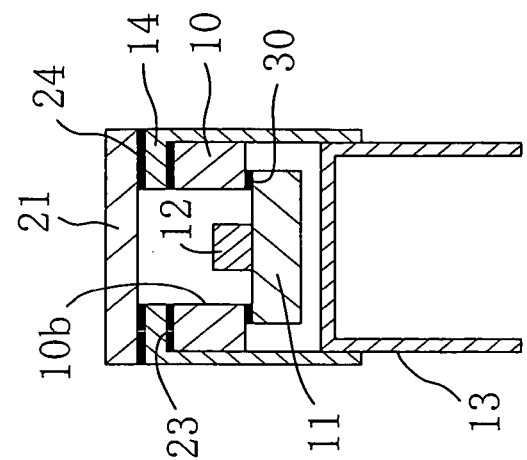
FIGS. 6A and 6B are cross sectional views of the optical device according to a third embodiment of the present invention taken along lines IIa-IIa and IIb-IIb, respectively, in FIG. 1.
Figure 6A:
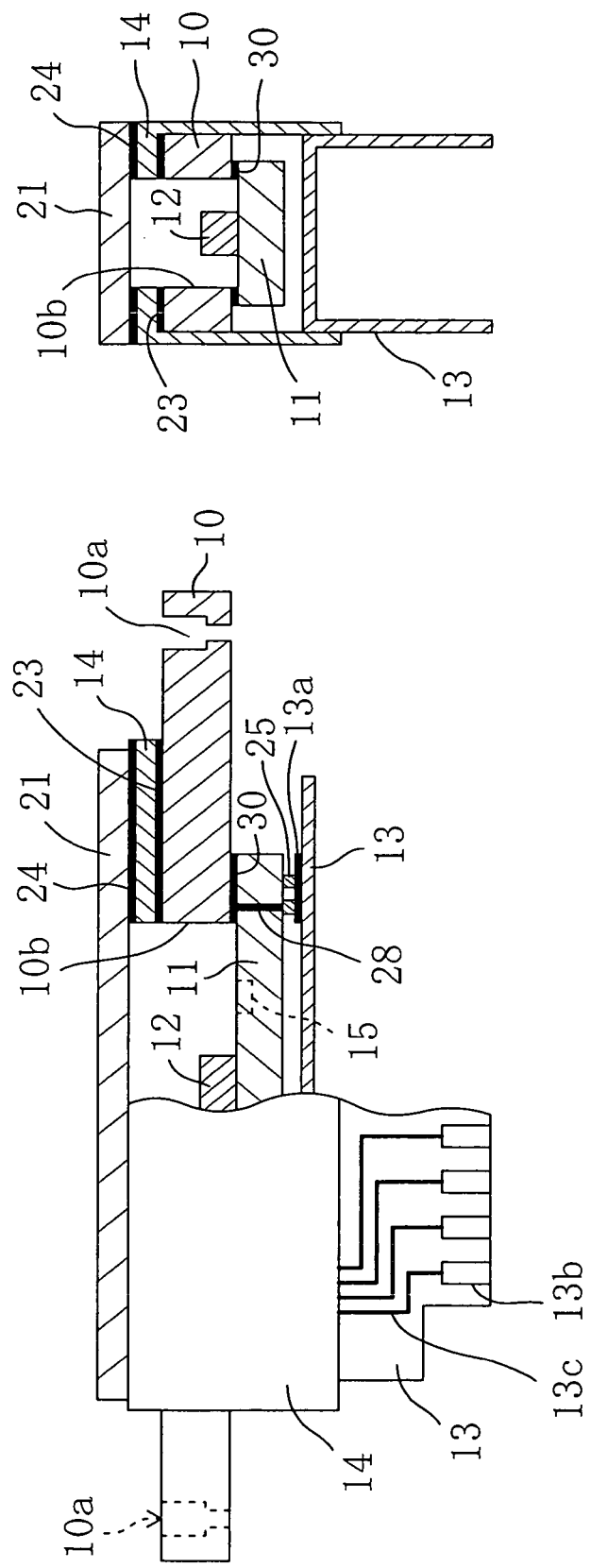

FIGS. 6A and 6B are cross sectional views of an optical device according to a third embodiment of the present invention taken along lines IIa-IIa and IIb-IIb, respectively, in FIG. 1.

As shown in FIGS. 6A and 6B, the optical device of the third embodiment includes a copper plate 10 serving as a base with a cooling function, a flexible board 13 having a wiring pattern; a light receiving element substrate 11 serving as an optical element chip of which the principal surface is in contact with the bottom surface of the copper plate 10 and which is connected at the back side with the flexible board 13; a light emitting element 12 serving as an optical element mounted on the principal surface of the light receiving element substrate 11; a light receiving element 15 serving as an optical element provided at the principal surface of the light receiving element substrate 11; a metallic supporting frame 14 attached to the top surface of the copper plate 10 through an adhesive layer 23 and extending from opposite side surfaces of the cooper plate 10 to partway along the sidewalls of the flexible board 13 bent downward in an inverted U-shape to support the bent flexible board 13; and a glass window 21 attached to the top surface of the supporting frame 14 through an adhesive layer 24.

A wiring pattern is formed in one surface of the flexible board 13. The wiring pattern includes internal terminals 13a for establishing signal connection between the light receiving element substrate 11 and the light emitting element 12; external terminals 13b for establishing signal connection with external equipment; and wirings (printed wirings) 13c for connecting the internal terminals 13a and the external terminals 13b. In the light receiving element substrate 11, a through hole connection member 28 for electrically connecting the wiring pattern on the principal-surface side (not shown) and a pad electrode on the back-surface side (not shown) is provided. The through hole connection member 28 is constituted by a metal film placed on the wall surface of a hole passing through the light receiving element substrate 11, or a conductive plug filling the entire hole, and is connected with a pad electrode provided on the back surface of the light receiving element substrate 11 directly or via a wire. Moreover, the internal terminal 13a of the flexible board 13, which are arranged in two rows, are electrically connected to pad electrodes provided on the back surface of the light receiving element substrate 11 by bumps 25 serving as conductive members. Although not shown, the wirings on the light receiving element substrate 11 are electrically connected to pad electrodes at the top surface of the light emitting element 12 by signal connection members such as fine metal wires. Therefore, both the light receiving element and the light emitting element are electrically connected with the wiring pattern of the flexible board 13. The flexible board 13 is bent in an inverted U-shape with the wiring pattern directed outward so that both sidewalls extend downward from opposite ends of the top surface of the flexible board 13. The center of the flexible board 13 has an opening 13d.

The center of the copper plate 10 has an opening 10b. Within the opening 10b, the light emitting element 12 and the light receiving element 15 on the light receiving element substrate 11 are located. In a general structure, although not shown, a mirror for reflecting upward a laser light transversely emitted from the light emitting element 12 is provided at the principal surface of the light receiving element substrate 11. Both ends of the copper plate 10 are formed with alignment holes 10a serving as reference points for aligning the light receiving element substrate 11 with the flexible board 13 in mounting the light receiving element substrate 11 onto the flexible board 13. Each alignment hole 10a has a stepped shape of which the upper part has a large diameter and the lower part has a small diameter. The lower part with a small diameter is a first alignment part serving as a reference point for aligning the light receiving element substrate 11 with the flexible board 13 in mounting the light receiving element substrate 11 onto the flexible board 13, while the upper part with a large diameter is a second alignment part in which a positioning pin is engaged in mounting a lens system on the optical device.

In the third embodiment, since the flexible board 13 is placed below the light receiving element substrate 11, not between the copper plate 10 and the light receiving element substrate 11, the light receiving element substrate 11 and the copper plate 10 are joined to each other with an adhesive layer 30 interposed therebetween.

The supporting frame 14 provides a secure connection among the light receiving element substrate 11, the flexible board 13 and the copper plate 10, and performs a function of supporting the flexible board 13 in a downwardly bent posture.

As mentioned above, the optical device according to the third embodiment is different from the optical device according to the first embodiment in that the through hole connection member 28 is provided in the light receiving element substrate 11, that the light receiving element substrate 11 is mounted on the flexible board 13 with the principal surface of the light receiving element substrate 11 directed upward, and that the top surface of the light receiving element substrate 11 is joined to the bottom surface of the copper plate 10 with only the thin adhesive layer 30 interposed therebetween. However, the other configurations of the third embodiment are the same as those of the first embodiment. Hence, the optical device of the third embodiment can achieve substantially the same effects as the first embodiment.

Particularly in the optical device of the third embodiment, since the light receiving element substrate 11 is joined to the copper plate 10 with only the thin adhesive layer 30 interposed therebetween, the optical device has an advantage of efficiently dissipating heat generated in the light emitting element 12 through the light receiving element substrate 11 to the copper plate 10.

Illustration of a process of fabricating the optical device of the third embodiment is omitted. In this embodiment, during the process steps illustrated in FIGS. 3A and 3B according to the first embodiment, after mounting the light receiving element substrate 11 onto the flexible board 13 with the principal surface of the light receiving element substrate 11 being directed upward, the top surface of the light receiving element substrate 11 and the lower surface of the copper plate 10 are connected with each other through an adhesive layer, and then the process steps illustrated in FIGS. 3C and 3D are performed. Thus, the structure shown in FIG. 5 can be easily obtained.

The third embodiment has described the optical device including the light receiving element substrate 11 and the light emitting element 12, but the optical device of the present invention may include at least either a light receiving element or a light emitting element as an optical element.

The supporting frame 14 may be fixed to the flexible board 13 through an adhesive layer or without an adhesive layer as shown in FIGS. 6A and 6B.

In the third embodiment, the optical device may also be used as a hologram unit by mounting a hologram in lieu of the glass window like the modification of the first embodiment.

Moreover, in the third embodiment, the flexible board 13 may also be covered with the supporting frame 14 from below to support the flexible board 13 in an outwardly bent posture like the second embodiment with respect to the first embodiment.

In lieu of the copper plate 10 serving as a base of the present invention, provided may be a base made of materials having high thermal conductivity such as other metals or ceramic.

The present invention may utilize as an optical device having a light receiving element or a light receiving/emitting element and incorporated into various equipment such as an optical pickup using light, in particular laser light.

What is claimed is:

1. An optical device, comprising:
a base having an opening;
a flexible board attached to a bottom surface of the base through an adhesive layer and having a wiring pattern;
an optical element chip that is placed below the base, has an optical element provided at a principal surface thereof and located within the opening of the base in a two-dimensional view, and is mounted on the wiring pattern of the flexible board with a conductive member interposed therebetween and with the principal surface of the optical element chip confronting the flexible board; and
a frame covering the top surface and opposite two side surfaces of the base and part of the flexible board, and supporting the flexible board with the flexible board bent downward.

2. The optical device of claim 1, further comprising a light transparent member attached to the frame.

3. The optical device of claim 2, wherein
the light transparent member is a hologram, and
the optical device serves as a hologram unit.

4. The optical device of claim 1, further comprising a light transparent member attached to the base.

5. The optical device of claim 4, wherein
the light transparent member is a hologram, and
the optical device serves as a hologram unit.

6. The optical device of claim 1, wherein the base is formed with a first alignment part serving as a reference point for alignment in mounting the optical element chip on the wiring pattern of the flexible board.

7. The optical device of claim 1, wherein the base is formed with a second alignment part serving as a reference point for alignment in mounting an optical component on the optical device.

8. An optical device, comprising:
a base having an opening;
a flexible board placed below the base and having a wiring pattern;
an optical element chip that is placed below the base, has an optical element provided at a principal surface thereof and located within the opening of the base in a two-dimensional view, and is mounted on the wiring pattern of the flexible board with a conductive member interposed therebetween and with the principal surface of the optical element chip confronting the flexible board; and
a frame covering the back surface of the optical element chip and part of the flexible board, and pressing the part of the flexible board against opposite two side surfaces of the base with the flexible board bent upward.

9. An optical device, comprising:
a base having an opening;
a flexible board placed below the base and having a wiring pattern;
an optical element chip that is placed below the base, has an optical element provided at a principal surface thereof and located within the opening of the base in a two-dimensional view, and is mounted on the wiring pattern of the flexible board with a conductive member interposed therebetween and with a back surface of the optical element chip confronting the flexible board; and
a frame supporting the flexible board with the flexible board bent upward or downward, wherein
a through hole connection member is provided in the optical element chip to pass through the optical element chip from the principal surface to the back surface thereof and electrically connected with the wiring pattern through the conductive member.

10. The optical device of claim 9, wherein the frame covers the top surface and opposite two sides surfaces of the base and part of the flexible board and supports the flexible board with the flexible board bent downward.

11. The optical device of claim 10, further comprising a light transparent member attached to the frame.

12. The optical device of claim 9, wherein the frame covers part of the back surface and part of opposite two side surfaces of the flexible board, and presses part of the flexible board against opposite two side surfaces of the base.

13. The optical device of claim 12, further comprising a light transparent member attached to the base.

14. The optical device of claim 9, wherein the optical element chip is attached to the bottom surface of the base through an adhesive layer.

* * * * *